United States Patent [19]

Lim

[11] Patent Number: 5,747,372

[45] Date of Patent: May 5, 1998

[54] SEMICONDUCTOR DEVICE AND METHOD FOR FABRICATING SAME

[75] Inventor: Geun Lim, Chungcheongbuk-do, Rep. of Korea

[73] Assignee: LG Semicon Co., Ltd., Chungcheongbuk-do, Rep. of Korea

[21] Appl. No.: 692,133

[22] Filed: Aug. 5, 1996

[30] Foreign Application Priority Data

Dec. 26, 1995 [KR] Rep. of Korea ............... 1995 56313

[51] Int. Cl.$^6$ ............................................. H01L 21/336
[52] U.S. Cl. ............................................. 438/298; 438/305
[58] Field of Search ........................... 437/24, 29, 34, 437/44, 45, 74; 438/231, 289, 233, 586, 298, 305

[56] References Cited

U.S. PATENT DOCUMENTS

| | | | |
|---|---|---|---|
| 4,356,042 | 10/1982 | Gedaly et al. | 437/45 |
| 4,356,623 | 11/1982 | Hunter | 29/571 |
| 4,366,613 | 1/1983 | Ogura et al. | 29/571 |
| 4,843,023 | 6/1989 | Chui et al. | 438/231 |
| 4,859,619 | 8/1989 | Wu et al. | 437/45 |
| 4,874,713 | 10/1989 | Gioia | 438/231 |
| 4,945,066 | 7/1990 | Kang et al. | 437/45 |
| 5,026,656 | 6/1991 | Matloubian et al. | 437/45 |
| 5,122,474 | 6/1992 | Harrington | 438/231 |
| 5,346,835 | 9/1994 | Malhi et al. | 437/45 |
| 5,396,096 | 3/1995 | Akamatsu et al. | 437/74 |
| 5,399,513 | 3/1995 | Liou et al. | 437/44 |
| 5,464,782 | 11/1995 | Koh | 437/45 |
| 5,474,940 | 12/1995 | Tsukamoto et al. | 437/44 |
| 5,550,074 | 8/1996 | Lin | 437/44 |
| 5,610,088 | 3/1997 | Chang et al. | 437/44 |

FOREIGN PATENT DOCUMENTS 1-196861  8/1989  Japan .................. 437/44

*Primary Examiner*—John Niebling
*Assistant Examiner*—Michael S. Lebentritt
*Attorney, Agent, or Firm*—Morgan, Lewis & Bockius LLP

[57] ABSTRACT

A semiconductor device includes a semiconductor substrate having low impurities of a first conductivity type including a field region and an active region, a first conductivity type region of high impurities at the field region of the semiconductor substrate, a first insulation film on the first conductivity type region of high impurities, a gate electrode at the active region of the semiconductor substrate, a second conductivity type region of high impurities on a central region of the semiconductor substrate between the gate electrode and the first insulation film, and second conductivity type regions of low impurities between the gate electrode and the second conductive type region of high impurities, and between the first insulation film and the second conductivity type region of high impurities.

20 Claims, 5 Drawing Sheets

SEMICONDUCTOR DEVICE AND METHOD FOR FABRICATING SAME

BACKGROUND OF THE INVENTION

1. Field of the Invention

The present invention relates to a semiconductor device and a method for fabricating the same, and more particularly, to a semiconductor device including an MOS transistor with an LDD (Lightly Doped Drain) structure and a method for fabricating the same.

2. Discussion of the Related Art

In general, a method for fabricating a conventional semiconductor device having an LDD structure includes the steps as follows. First, as shown in FIG. 1A, an oxide film 2 and a nitride film 3 are sequentially deposited on a p-type silicon substrate 1. Next, a region 4 is formed by an etch process, and an ion implantation of $p^+$ type high impurities is performed in the region 4 to improve insulating characteristics. As shown in FIG. 1B, a field oxide film 6 is then formed on a field ion implantation region 5 of $p^+$ type high impurities, and the nitride film 3 and the oxide film 2 are sequentially removed. Next, as shown in FIG. 1C, a channel ion implantation is performed at an active region where an MOS transistor is to be formed to adjust a threshold voltage. Referring to FIG. 1D, a gate oxide film 8, a gate polysilicon film 9, and a CAP oxide film 10 are sequentially deposited on the active region of the substrate 1, and a gate 7 is patterned by a photo etching process. As shown in FIG. 1E, source/drain regions 12 of the MOS transistor is formed at a center region of the substrate 1 between the field oxide film 6 and the gate 7. An ion implantation of an $n^-$ type low impurities is performed in the source/drain regions 12 using a photoresist 11 and the gate 7 as an implantation mask to form an LDD region. Side walls 13 are then formed, as shown in FIG. 1F, at both sides of the gate 7, by an etch back after depositing an oxide film. Next, as shown in FIG. 1G, source/drain ion implantation regions 15 are formed by using a photoresist 14, the gate 7, and the side walls 13 as an implantation mask. Finally, as shown in FIG. 1H, the photoresist 14 is removed to form LDD regions 16 of $n^-$ type low impurities in the source/drain regions 12.

As a result of the above process steps, an MOS transistor having an LDD structure is fabricated. However, the above conventional technology has several problems.

First, since the source/drain ion implantation regions 15 of $n^+$ type high impurities directly adjoin the field ion implantation region 5 of $p^+$ type high impurities, the ion density of the PN junction region between the ion implantation region 15 and the field ion implantation region 5 becomes high. As a result, when a voltage in the reverse direction is applied between source/drain regions 12 and the substrate 1, the electric field adjacent to the PN junction region becomes high which causes an increase in the leakage current.

Second, because a dry etching process is performed to etch the oxide film for forming the side walls of the gate, the potential over-etching of such process causes a loss in the field oxide film 6. As a result, the insulation between the active regions is reduced.

Finally, the conventional method is inconvenient because two separate photo processes must be performed in order to form the source/drain regions 12 and the LDD regions 16.

SUMMARY OF THE INVENTION

Accordingly, the present invention is directed to a semiconductor device and a method for fabricating the same that substantially obviates one or more of the problems due to limitations and disadvantages of the related art.

An object of the present invention is to provide a semiconductor device and a method for fabricating the same with a reduced leakage current around a PN junction region when a voltage in reverse direction between source/drain regions and a substrate is applied.

Another object of the present invention is to provide a semiconductor device and a method for fabricating the same with improved insulation between active regions.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, the method for fabricating the semiconductor device according to the present invention includes the steps of defining an active region and a field region on a semiconductor substrate having low impurities of a first conductivity type, forming a first conductivity type region of high impurities at the field region and a field insulation film on the first conductivity type region of high impurities, forming a gate insulation film on the active region, a gate electrode on the gate insulation film, and a first insulation film on the gate electrode, forming a second insulation film on the semiconductor substrate, the field insulation film, and the first insulation film, forming a third insulation film at sides of the gate electrode and over the field region, forming a second conductivity type region of high impurities on the semiconductor substrate between the gate electrode and the field insulation film using the third insulation film and the gate electrode as a mask, and forming a second conductivity type region of low impurities between the gate electrode and the second conductivity type region of high impurities, and between the field insulation film and the second conductivity type region of high impurities using the gate electrode and the field insulation film as a mask after removing the third insulation film.

In another aspect, the semiconductor device according to the present invention includes a semiconductor substrate having low impurities of a first conductivity type including a field region and an active region, a first conductivity type region of high impurities at the field region of the semiconductor substrate, a first insulation film on the first conductivity type region of high impurities, a gate electrode at the active region of the semiconductor substrate, a second conductivity type region of high impurities on a central region of the semiconductor substrate between the gate electrode and the first insulation film, and second conductivity type regions of low impurities between the gate electrode and the second conductive type region of high impurities, and between the first insulation film and the second conductivity type region of high impurities.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 3:
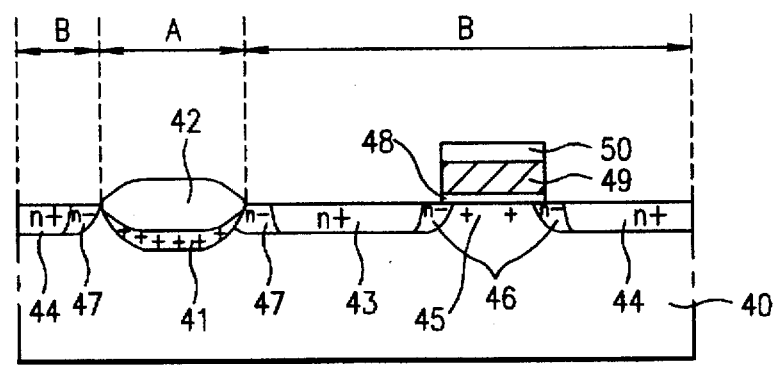
FIG. 3 is a cross-sectional view illustrating a semiconductor device according to an embodiment of the present invention.

FIG. 3 shows a semiconductor device including an MOS transistor having an LDD structure according to the present invention. As shown in FIG. 3, the MOS transistor having an LDD structure includes a field region A, an active region B, $n^-$ type low impurity diffused regions 46 (LDD region), $n^-$ type low impurity diffused regions 47, and a gate electrode (see 48, 49 and 50). The field region A includes a $p^+$ type high impurity diffused region 41 formed on a p-type substrate 40 by ion implantation for improving the insulation between the respective MOS devices, and a field oxide film 42 deposited on the $p^+$ type high impurity diffused region 41. The active region B includes source/drain regions 43 and 44 formed of $n^+$ type high impurities, and a p-type channel region 45 implanted by a p-type ion between the source/drain regions 43 and 44 for adjusting a threshold voltage. The $n^-$ type low impurity diffused regions 46 (LDD region) are formed between both ends of the channel region 45 and the source/drain regions 43 and 44, respectively. The $n^-$ type low impurity diffused regions 47 are respectively formed in the area between the p+type high impurity diffused region 41 of the field region A and the source/drain regions 43 and 44 with $n^+$ type high impurities in the active region B. The gate electrode includes a gate oxide film 48, a polysilicon layer 49, and a CAP oxide layer 50.

In the above device, the density of the $n^-$ type low impurity diffused region 47 is similar to that of the $n^-$ type low impurity diffused region 46.

If the MOS transistor having an LDD structure of the present invention, since $n^-$ type low impurity diffused regions 47 are formed in a region between the source/drain regions 43 and 44 of n+type high impurities formed in the active region B and the $p^+$ type high impurity diffused region 41 formed in the field region A, a leakage current in the PN junction region is significantly reduced when a voltage is applied between source/drain regions and the substrate in a reverse direction.

The respective process steps in fabricating an MOS transistor with an LDD structure according to the present invention will now be described referring to FIGS. 2A to 2I.

Figure 2A:
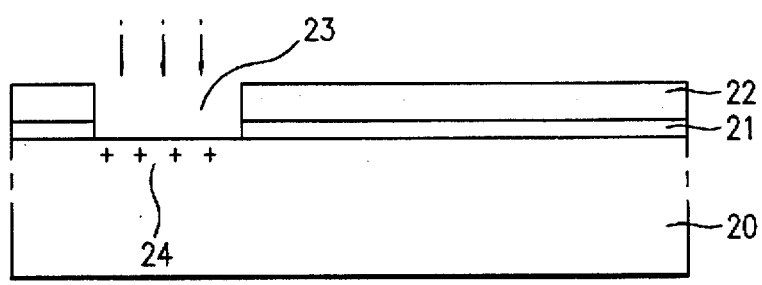
FIGS. 2A to 2I are cross-sectional views illustrating process steps in fabricating a semiconductor device according to the present invention.
Figure 2B:
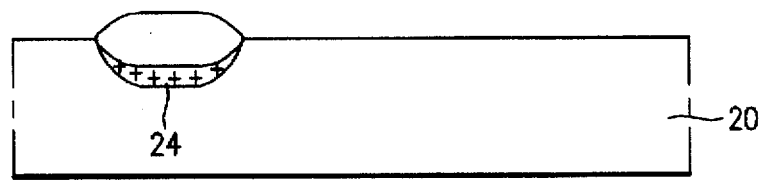

As shown in FIGS. 2A and 2B, an oxide film 21 and a nitride film 22 are sequentially deposited on a p-type silicon substrate 20 and then a region 23 is formed by a etching process. A $p^+$ type high impurity diffused region 24 is formed by an ion implantation of $p^+$ type high impurities. On this diffused region 24, a field oxide film 25 is formed. Subsequently, the nitride film 22 and the oxide film 21 are sequentially removed.

Figure 2C:
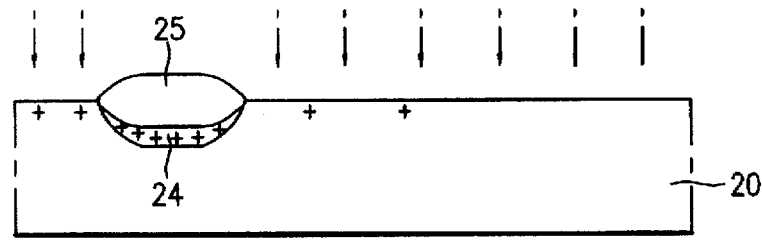
Figure 2D:
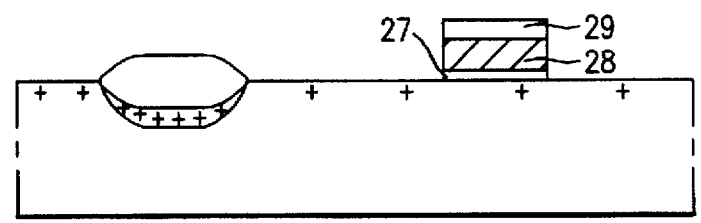

Next, as shown in FIGS. 2C and 2D, a $p^+$type ion implantation is performed at an active region in which the MOS transistor will be formed, for the purpose of adjusting channel threshold voltage $V_T$. Then, a gate is patterned through a photo-etching process after depositing a gate oxide film 27, a gate polysilicon film 28, and a CAP oxide film 29, respectively.

Figure 2E:
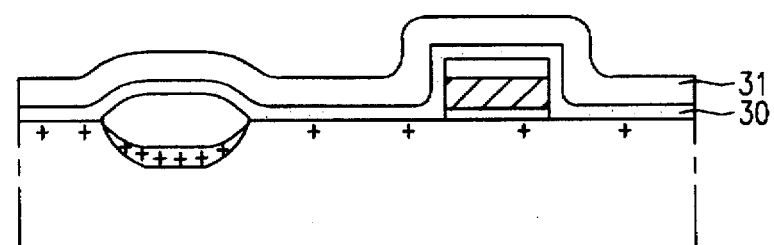
Figure 2F:
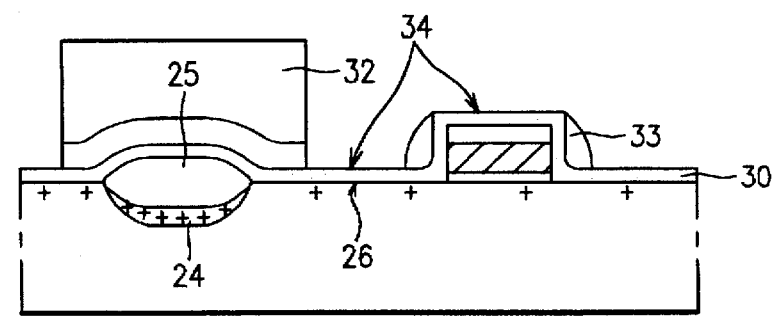

A thin nitride film 30 and an oxide film 31 are deposited, as shown in FIG. 2E. Referring to FIG. 2F, the oxide film 31 is then etched using a photoresist 32 as an implantation mask. The photoresist 32 is formed over the field oxide film 25 and extends to a portion of the active region 26. As a result of the etching, side walls 33 of the gate are formed, and the thin nitride film 30 is exposed through openings 34.

Figure 2G:
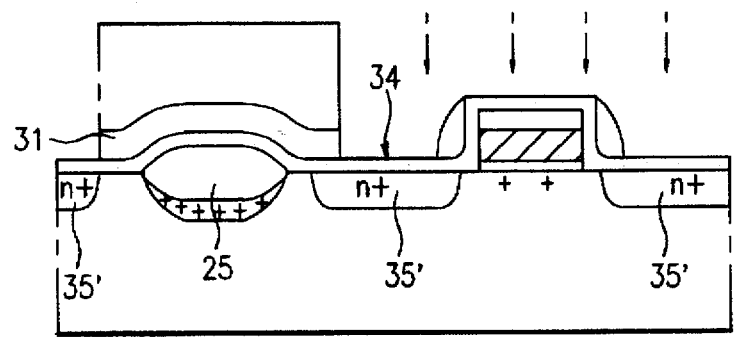

With reference to FIG. 2G, source/drain regions 35 and 35' of $n^+$ high impurities are formed by ion implantation through the openings 34. Then, the photoresist 32 and the oxide film 31 are removed.

Figure 2H:
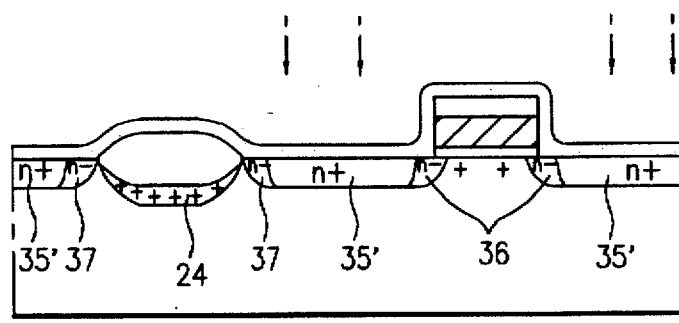
Figure 2I:
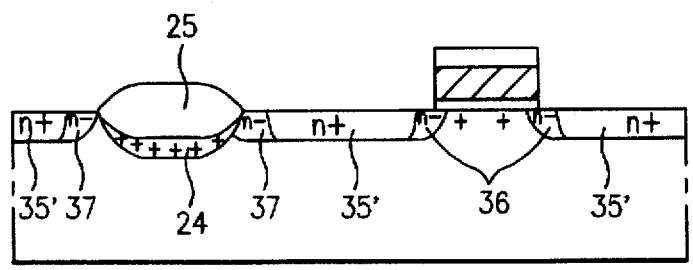

As shown in FIG. 2H, LDD regions 36 of $n^-$ type low impurities are formed on the source/drain regions at both sides of the channel (defined by the area under the gate) by ion implantation of $n^-$ type low impurities using the field oxide film 25 and the gate as an implantation mask. Simultaneously, $n^-$ type low impurity diffused regions 37 are formed between the field oxide film 25 and the source/drain regions 35 and 35', respectively. As shown in FIG. 2I, the nitride film 30 is then removed by a wet etching process.

Accordingly, the present invention provides a semiconductor device and a method for fabricating the same in which a leakage current due to a PN junction during applying a voltage in reverse direction between source/drain regions and a substrate is reduced by forming a diffused region of low impurities between a field ion implantation region of high impurities and source/drain ion implantation regions of high impurities. In addition, the present invention provides a semiconductor device and a method for fabricating the same in which insulating characteristics between active regions are improved by removing the loss of a field oxide film due to a dry etching process.

The method for fabricating the MOS transistor having an LDD structure of the present invention has advantages as follows. First, since the $n^-$ type low impurity regions 37 are formed in the active region between the $p^+$ type high impurity diffused layer 24 of the field region and the source/drain regions 35 and 35' of $n^+$ type high impurities, a leakage current is considerably reduced by the $P+N^-$ junction (defined by the area between the $p^+$ type high impurity diffused layer 24 and $n^-$ type low impurity region 37) when a voltage in the reverse direction is applied between the drain/source regions and the substrate.

In addition, since the nitride film 30 is formed under the oxide film 31, the field oxide film 25 is protected during the dry etching process to form the side wall 33 of the gate. As a result, desirable insulation is maintained between the active regions.

Figure 1A:
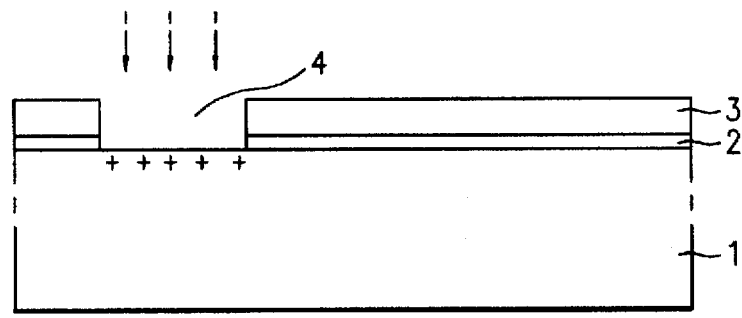
FIGS. 1A to 1H are cross-sectional views illustrating conventional process steps in fabricating a semiconductor device.
Figure 1B:
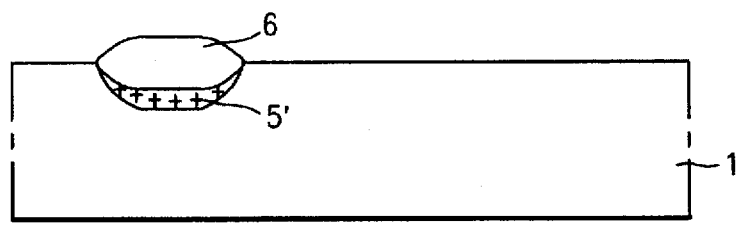
Figure 1C:
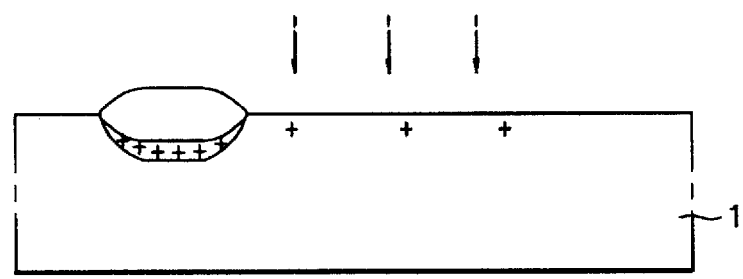
Figure 1D:
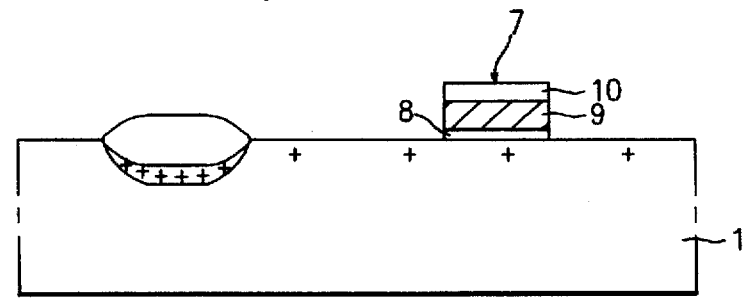
Figure 1E:
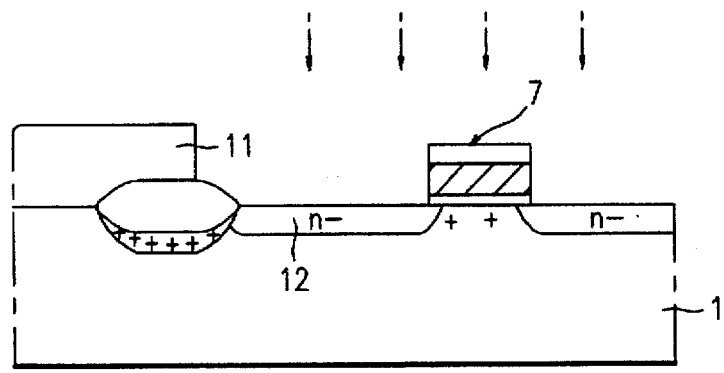
Figure 1F:
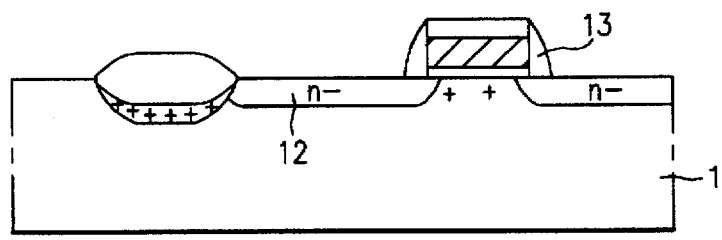
Figure 1G:
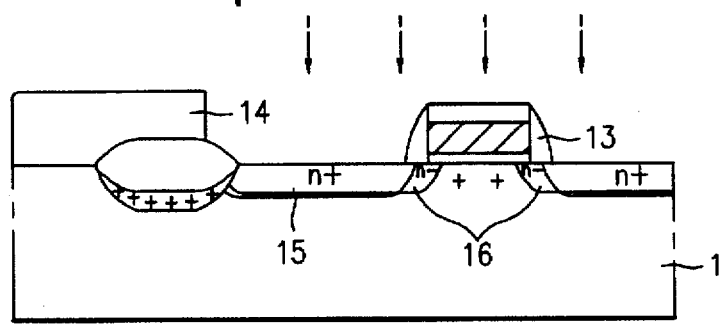
Figure 1H:
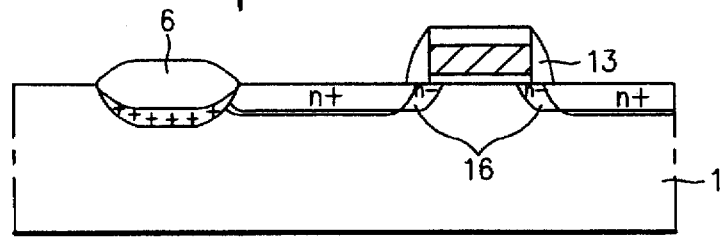

Furthermore, to form the LDD regions of $n^-$ type low impurities and $n^+$ type source/drain regions, conventional technology requires two photo processes, as shown in FIGS. 1E and 1G. The method according to the present invention only requires one photo process, thus simplifying the fabrication process.

It will be apparent to those skilled in the art that various modifications and variations can be made in the MOS transistor and in the fabrication process of the MOS transistor of the present invention without departing from the scope or spirit of the invention. Thus, it is intended that the present invention cover the modifications and variations of this invention provided they come within the scope of the appended claims and their equivalents.

What is claimed is:

1. A method for fabricating a semiconductor device comprising the steps of:
   defining an active region and a field region on a semiconductor substrate having a low impurity concentration of a first conductivity type;
   forming a first conductivity type region of high impurity concentration at the field region and a field insulation film on the first conductivity type region of high impurity concentration;
   forming a gate insulation film on the active region, a gate electrode on the gate insulation film, and a first insulation film on the gate electrode;
   forming a second insulation film on the semiconductor substrate, the field insulation film, and the first insulation film;
   forming a third insulation film at sides of the gate electrode and over the field region;
   forming a second conductivity type region of high impurity concentration on the semiconductor substrate between the gate electrode and the field insulation film using the third insulation film and the gate electrode as a mask; and
   forming a second conductivity type region of low impurity concentration between the gate electrode and the second conductivity type region of high impurity concentration, and between the field insulation film and the second conductivity type region of high impurity concentration using the gate electrode and the field insulation film as a mask after removing the third insulation film.

2. The method for fabricating a semiconductor device as claimed in claim 1, wherein the first conductivity type is a p-type and the second conductive type is an n-type.

3. The method for fabricating a semiconductor device as claimed in claim 1, wherein the second insulation film includes a nitride film and the third insulation film includes an oxide film.

4. The method for fabricating a semiconductor device as claimed in claim 3, wherein the nitride film is formed with a first thickness and the oxide film is formed with a second thickness, the first thickness being thinner than the second thickness.

5. The method for fabricating a semiconductor device as claimed in claim 3, wherein the step of forming the third insulation film over the field region includes the step of etching the oxide film using a photoresist as a mask.

6. The method for fabricating a semiconductor device as claimed in claim 1, wherein the step of forming the active region includes the step of ion implanting the substrate.

7. The method for fabricating a semiconductor device as claimed in claim 1, wherein the step of forming the field region includes the steps of:
   forming a fourth insulation film over the semiconductor substrate; and
   etching a portion of the fourth insulation film.

8. The method for fabricating a semiconductor device as claimed in claim 7, wherein the fourth insulation film includes an oxide layer and a nitride layer.

9. The method for fabricating a semiconductor device as claimed in claim 7, wherein the step of forming the first conductivity type region of high impurity concentration includes the step of implanting ions to the semiconductor substrate at the field region through the portion of the fourth insulation film.

10. A method for fabricating a semiconductor device comprising the steps of:
    defining an active region and a field region on a semiconductor substrate of a first conductivity type;
    forming a first conductivity type region of high impurity concentration on the field region and a field insulation film on the first conductivity type region of high impurity concentration;
    forming a gate electrode on the active region;
    forming a first insulation film on the semiconductor substrate, the field insulation film, and the gate electrode;
    forming a second insulation film at sides of the gate electrode and over the field region;
    forming a second conductivity type region of high impurity concentration on a portion of the semiconductor substrate between the gate electrode and the field insulation film; and
    forming a second conductive type region of low impurity concentration between the gate electrode and the second conductivity type region of high impurity concentration, and between the field insulation film and the second conductivity type region of high impurity concentration.

11. The method for fabricating a semiconductor device as claimed in claim 10 wherein the step of forming the second conductivity type region of high impurity concentration includes the step of implanting ions using the second insulation film and the gate electrode as a mask.

12. The method for fabricating a semiconductor device as claimed in claim 10, wherein the step of forming the second conductivity type region of low impurity concentration includes the steps of:
    removing the second insulation film; and
    implanting ions using the gate electrode and the field insulation film as a mask.

13. The method for fabricating a semiconductor device as claimed in claim 10, wherein the first conductivity type is a p-type and the second conductive type is an n-type.

14. The method for fabricating a semiconductor device as claimed in claim 10, wherein the first insulation film includes a nitride film and the second insulation film includes an oxide film.

15. The method for fabricating a semiconductor device as claimed in claim 14, wherein the nitride film is formed with a first thickness and the oxide film is formed with a second thickness, the first thickness being thinner than the second thickness.

16. The method for fabricating a semiconductor device as claimed in claim 14, wherein the step of forming the second insulation film over the field region includes the step of etching the oxide film using a photoresist as a mask.

17. The method for fabricating a semiconductor device as claimed in claim 10, wherein the step of forming the active region includes the step of ion implanting the substrate.

18. The method for fabricating a semiconductor device as claimed in claim 10, wherein the step of forming the field region includes the steps of:
    forming a third insulation film over the semiconductor substrate; and
    etching a portion of the third insulation film.

19. The method for fabricating a semiconductor device as claimed in claim 18, wherein the third insulation film includes an oxide layer and a nitride layer.

20. The method for fabricating a semiconductor device as claimed in claimed in claim 18, wherein the step of forming the first conductivity type region of high impurity concentration includes the step of implanting ions to the semiconductor substrate at the field region through the portion of the third insulation film.

* * * * *